United States Patent [19]

Mizuishi et al.

[11] Patent Number: 5,356,113
[45] Date of Patent: Oct. 18, 1994

[54] ISOLATION VALVE FOR SINGLE CRYSTAL PULLING APPARATUS

[75] Inventors: Koji Mizuishi; Kouzou Yokota; Katsuhiko Ogino, all of Annaka, Japan

[73] Assignee: Shin-Etsu Handotai Co., Ltd., Tokyo, Japan

[21] Appl. No.: 125,187

[22] Filed: Sep. 23, 1993

[30] Foreign Application Priority Data

Sep. 30, 1992 [JP] Japan .................. 4-285115

[51] Int. Cl.$^5$ .............................. F16K 3/16
[52] U.S. Cl. ........................ 251/167; 251/178
[58] Field of Search .................... 251/167, 178

[56] References Cited

U.S. PATENT DOCUMENTS

| | | | |
|---|---|---|---|
| 1,763,029 | 6/1930 | Wilson | 251/178 |
| 2,476,711 | 11/1943 | Edwards | |
| 3,717,322 | 2/1973 | Bernard | 251/167 X |
| 4,157,169 | 6/1979 | Norman | 251/167 X |

FOREIGN PATENT DOCUMENTS

| | | |
|---|---|---|
| 1464048 | 12/1966 | France . |
| 61-6194 | 1/1986 | Japan . |
| 2-252687 | 10/1990 | Japan . |

Primary Examiner—John C. Fox
Attorney, Agent, or Firm—Oliff & Berridge

[57] ABSTRACT

An isolation valve for a single crystal pulling apparatus providing a good sealing performance is disclosed. The apparatus comprises a casing having two opposite valve seats, a first valve seat having a first opening communicable with the main chamber of the apparatus, a second valve seat having a second opening communicable with the pull chamber of the apparatus. The body of the isolation valve includes a first plate movable in and out of contact with the first valve seat to open and shut the first opening, a second plate movable in and out of contact with the second valve seat to open and shut the second opening, and a bellows connecting the first and second plates. The isolation valve also comprises a holder holding the first plate out of contact with the first valve seat when the first plate is opposite to the first valve seat, a passage communicable with a fluid supply and the interior of the valve body, and a controller controlling the pressure of a working fluid supplied from the fluid supply into the interior of the valve body. The controller has a first set pressure at which the first and second plates are in contact with the first and second valve seats and a second set pressure at which the first and second plates are out of contact with the first and second valve seats.

11 Claims, 3 Drawing Sheets

ISOLATION VALVE FOR SINGLE CRYSTAL PULLING APPARATUS

BACKGROUND OF THE INVENTION

1. Field of the Invention

The present invention relates to an isolation or gate valve for a single crystal pulling apparatus opening and shutting a passage between a main chamber and a pull chamber of the single crystal pulling apparatus.

2. Description of the Related Art

A single crystal pulling apparatus in accordance with the Czochralski method of pulling a single crystal rod from a melt of a raw crystal, e.g., polycrystal comprises a cup-shaped crucible holding a raw crystal and placed in the main chamber, a hollow cylindrical heater surrounding the crucible, and a hollow cylindrical heat insulator surrounding the heater. The single crystal pulling apparatus further comprises a hollow cylinder defining the pull chamber joined with the top end of the hollow cylinder defining the main chamber. A single crystal rod which is pulled from the melt into the pull chamber is taken out of the pull chamber. An isolation valve is provided in a passage between the main chamber and the pull chamber for opening and shutting this passage.

Japanese unexamined patent application publication HEI.2-252687 (Patent Application No.1-70692) discloses an example of a prior art isolation valve. FIG. 4 shows this example. The prior art isolation valve 1 comprises a valve body or shutter 2 in the form of a circular tray. The valve body 2 shuts and opens a cylindrical outlet 3a extending upwards from a flange 3 integrally disposed on the top of a hollow cylinder defining the main chamber. The exterior cylindrical surface of the outlet 3a has an O-ring 4 mounted thereon. The interior surface of the rim of the valve body 2 is in or out of sealing contact with the O-ring 4.

The valve body 2 is connected to a valve rod 6 by means of an arm 2a fastened by screw bolts to the valve body 2. The upper end of the valve rod 6 is connected to a piston 7a of an air cylinder 7 to move the valve rod 6 up and down. A joint between the piston 7a of the air cylinder 7 and the valve rod 6 has an arm 5 extending outside a casing of the isolation valve 1 for rotating the valve rod 6 and thereby the valve body 2. Thus, the valve rod 6 and the valve body 2 are movable up and down and rotatable in the casing of the isolation valve 1.

When the interior surface of the rim of the valve body 2 is in sealing contact with the O-ring 4 to shut the outlet 3a, the valve body 2 isolates the main chamber from the pull chamber. On the other hand, when the valve body 2 is rotated from the position shown in FIG. 4 to open a space above the outlet 3a, the isolation valve 1 enables the pull chamber to communicate with the main chamber.

The isolation valve 1 is employed in order to isolate the main chamber from the pull chamber when a single crystal (e.g., silicon single crystal) rod that has been pulled from a polycrystal melt held in the crucible placed in the main chamber which is taken out of the pull chamber. Employing the isolation valve enables continuously charging raw polycrystal in a melt while taking a pulled single crystal rod outside a pull chamber essentially without any intrusion of the outside air into the main chamber Alternatively, employing the isolation valve enables the sequent steps of placing a raw polycrystal charger in the pull chamber after a step of taking the single crystal rod out of the pull chamber, exhausting a gas out of the pull chamber to vacuum or substituting the gas in the pull chamber with an inert gas, and opening the isolation valve so that the raw polycrystal charger can additionally charge the raw polycrystal in the melt of the crucible.

If the isolation valve 1 isolates the main chamber from the pull chamber when the single crystal rod is taken out of the pull chamber after the single crystal rod has been pulled from the melt, the crucible holding the polycrystal melt in the main chamber can be at a high temperature while the main chamber is under vacuum or the atmosphere of an inert gas (e.g. gaseous argon) and the interior of the single crystal pulling apparatus can be protected from pollution by the outside air.

In a process of the sequent steps of opening the pull chamber to the outside air while the main chamber is under a reduced pressure, taking the single crystal rod out of the pull chamber and replacing a gas in the pull chamber with vacuum or the inert gas, the pressure of the main chamber happens to exceed the pressure of the pull chamber. In this case, a gas leaks from the main chamber to the pull chamber unless the isolation valve 1 securely seals the outlet 3a. This abnormally reduces the pressure of the main chamber, or by chance the replacing inert gas may diffuse from the pull chamber to the main chamber thanks to an excess in pressure of the replacing gas due to poor control. The diffusion of the replacing inert gas pollutes the atmosphere of the main chamber to disturb the pulling of the single crystal rod and adversely affect the quality of the single crystal rod.

When the isolation valve 1 shuts the outlet 3a, the operating arm 5 rotates the shaft 6 and the valve body 2 is turned from the space distant from the outlet 3a back to the space above the outlet 3a, and the air cylinder 7 depresses the valve body 2 to cap and seal the outlet 3a. In order to isolate the main chamber from the pull chamber, the air cylinder 7 is required to hold the capping of the valve body 2 on the outlet 3a.

The apparatus of continuously pulling the single crystal rod closes the door in the sidewall of the cylinder defining the pull chamber and then exhausts the gas out of the pull chamber to make the pull chamber vacuum, or repeats the steps of making the pull chamber vacuum and subsequent introducing the inert gas into the pull chamber after the single crystal rod is taken out of the pull chamber.

In the isolation valve 1, the assembly of the arm 2a and the valve body 2 cantilevers from the shaft 6, so that it is difficult that the air cylinder 7 drives a free or remote end of the valve body 2 to securely cap and seal the outlet 3a when the isolation valve 1 is required to fully isolate the main chamber from the pull chamber. Since the pressure of the pull chamber becomes negative to the pressure of the main chamber when the pull chamber is made vacuum, the pressure difference between the pull chamber and the main chamber may turn up the free end of the valve body 2. Once the free end of the valve body 2 is turned up, the sidewall of the outlet 3a and the free end of the valve body 2 produces a gap to impair the isolation between the pull chamber and the main chamber. The gas leak from the main chamber to the pull chamber causes the above problems. In particular, if the diameter of a semiconductor wafer sliced from the single crystal rod will be increased from now on and the diameter of the outlet 3a will accordingly increased, it is important to solve the above problems.

SUMMARY OF THE INVENTION

An object of the present invention is to provide an isolation valve for a single crystal pulling apparatus which provides a good isolation between the main chamber and the pull chamber.

In order to achieve the object, a first aspect of the present invention in an isolation valve for a single crystal pulling apparatus, the single crystal pulling apparatus having a main chamber in which a crucible holds a melt of a raw material and a pull chamber which receives a single crystal pulled from the melt, comprises: a valve casing having two opposite valve seats, a first valve seat having a first opening communicable with the main chamber, a second valve seat having a second opening communicable with the pull chamber; a valve body mounted movably within the valve casing, the valve body including a first plate in and out of sealing contact with the first valve seat to open and shut the first opening, a second plate movable in and out of sealing contact with the second valve seat to open and shut the second opening, and bellows connecting the first plate to the second plate; means for holding the first plate out of sealing contact with the first valve seat when the first plate is opposite to the first valve seat; a passage communicable with a fluid supply and with the interior of the valve body defined by the first plate, the second plate and the bellows, the passage enabling a working fluid from the fluid supply to pass to the interior of the valve body; and means, provided intermediate the passage, for controlling the pressure of the interior of the valve body, the controlling means having a first set pressure of the working fluid at which the first plate is in sealing contact with the first valve seat and the second plate is in sealing contact with the second valve seat, the controlling means having a second set pressure of the working fluid at which the first plate is out of sealing contact with the first valve seat and the second plate is out of sealing contact with the second valve seat.

The working fluid may comprise a gas or particularly an inert gas. The working fluid may comprise a liquid coolant. The passage may extend through the first plate.

When the isolation valve is in the position to isolate the main chamber from the pull chamber, the working fluid introduced into the interior of the valve body vertically extends the bellows to tightly contact the first and the second plates with the first and the second valve seats respectively. Thus, even if a possible force acts on the first plate normally thereto from the main chamber side, the working fluid pushes the overall first plate on the first valve seat with a uniform force since the second valve seat supports the second plate. This prevents part of the first plate from being turned up to produce a gap between the first plate and the first valve seat communicating with the first opening to enhance the sealing or isolation performance of the isolation valve.

In addition, if the single crystal rod is taken out of the pull chamber, the pull chamber is made vacuum and the inert gas is introduced into the pull chamber while the working fluid in the interior of the valve body is at the first set pressure, the isolation valve securely isolates the main chamber from the pull chamber.

Even if the inert gas as the working fluid leaks out of the bellows into the main chamber due to a possible damage in the bellows, no trouble happens in the main chamber.

In a second aspect of the present invention, the first valve seat is located around the first opening, the second valve seat has a position opposite to the first valve seat so that the second valve seat uniformly supports the first plate via the working fluid in the interior of the valve body when the first plate is in sealing contact with the first valve seat and the second plate is in sealing contact with the second valve seat.

Other objects, features and advantages of the present invention will be apparent from a consideration of the following description, taken in connection with the accompanying drawings.

DESCRIPTION OF THE PREFERRED EMBODIMENT

An isolation valve for a single crystal pulling apparatus according to an embodiment of the present invention will be described with reference to the drawings hereinafter.

Figure 1:
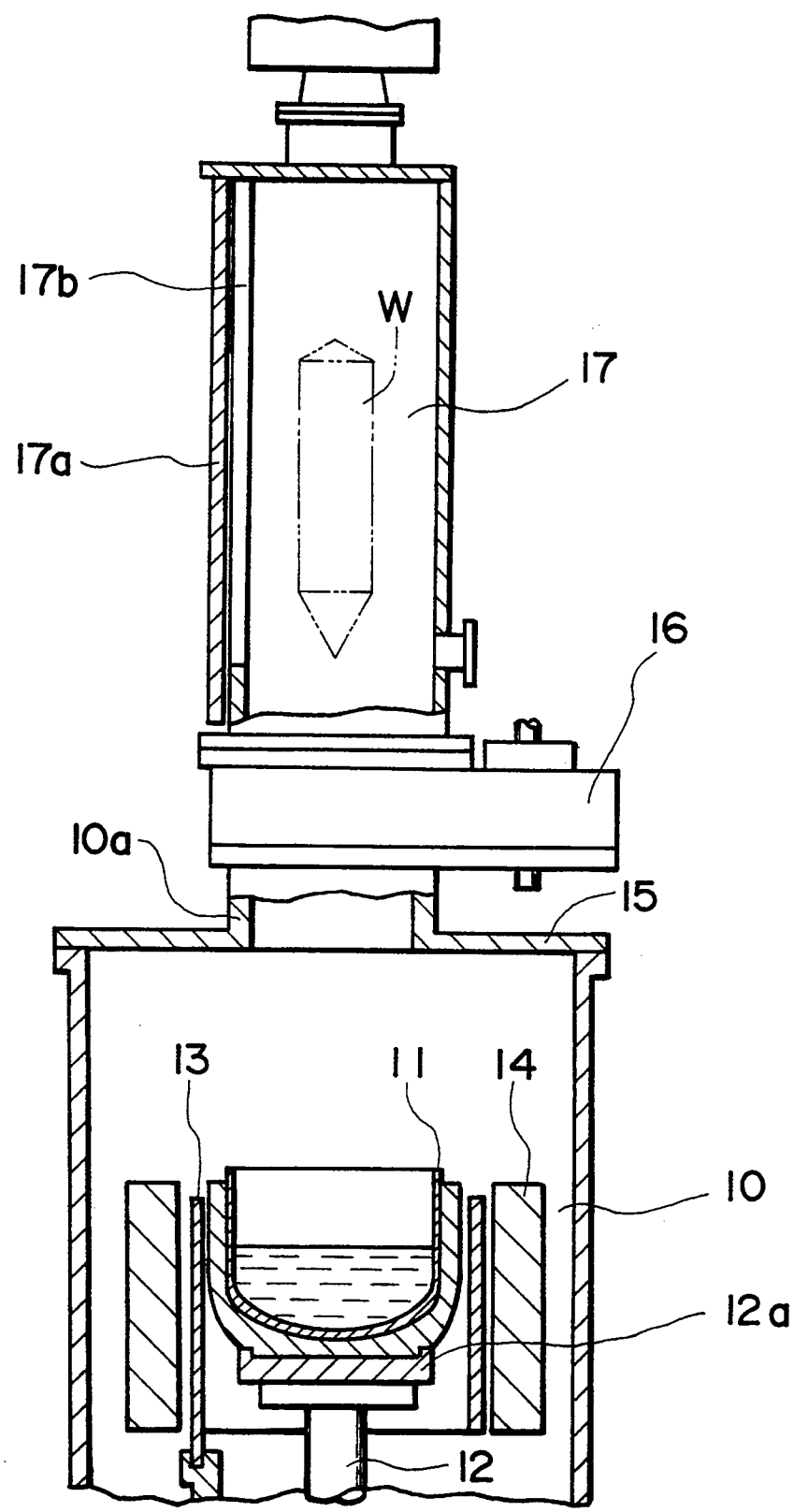
FIG. 1 is a schematic longitudinal section through a single crystal pulling apparatus.

First, a single crystal pulling apparatus comprising the isolation valve according to the present invention will be briefly described for better understanding the present invention with reference to FIG. 1 hereinafter.

The single crystal pulling apparatus comprises a first hollow cylinder of stainless steel defining a main chamber 10, a second hollow cylinder of stainless steel defining a pull chamber 17, and a casing of an isolation valve 16. The first cylinder defining the main chamber 10 contains a cup-shaped crucible 11 of quartz, a pedestal 12a on which the crucible 11 is placed, a crucible shaft 12 the top end of which supports the pedestal 12a, a hollow cylindrical heater 13 of carbon surrounding the crucible 11, and a hollow cylindrical heat insulator 14 of carbon surrounding the heater 13.

The first cylinder defining the main chamber 10 has a top wall 15 having a central outlet 10a upwardly extending coaxially with the first hollow cylinder. The second cylinder defining the pull chamber 17 extends upwardly from the outlet 10a coaxially with the first cylinder. The sidewall of the second cylinder 17 defines a window 17b and has a sliding door 17a opening and shutting the window 17b. The isolation valve 16 is located intermediate a passage between the outlet 10a and the second cylinder defining the pull chamber 17.

Figure 2:
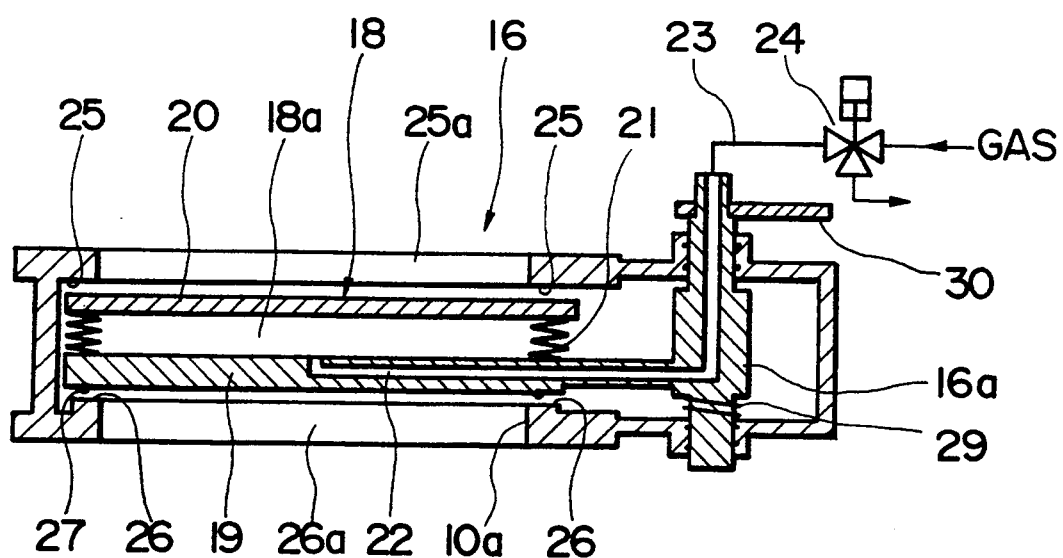
FIG. 2 is a schematic longitudinal section through an isolation valve according to an embodiment of the present invention.
Figure 3:
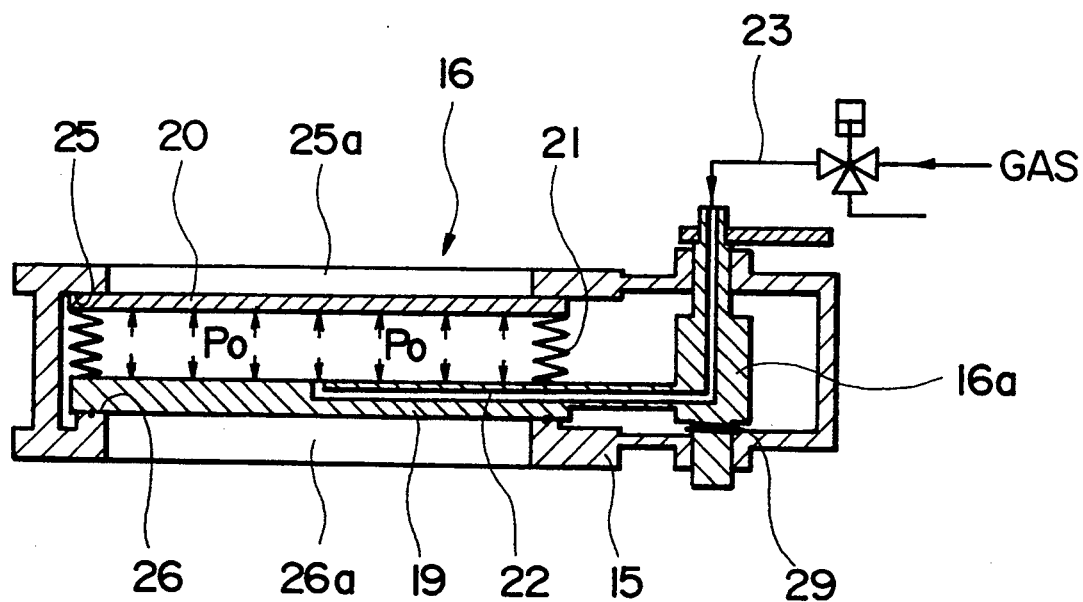
FIG. 3 is a schematic longitudinal section through the isolation valve according to the embodiment of the present invention with the isolation valve in the shutting position.
Figure 4:
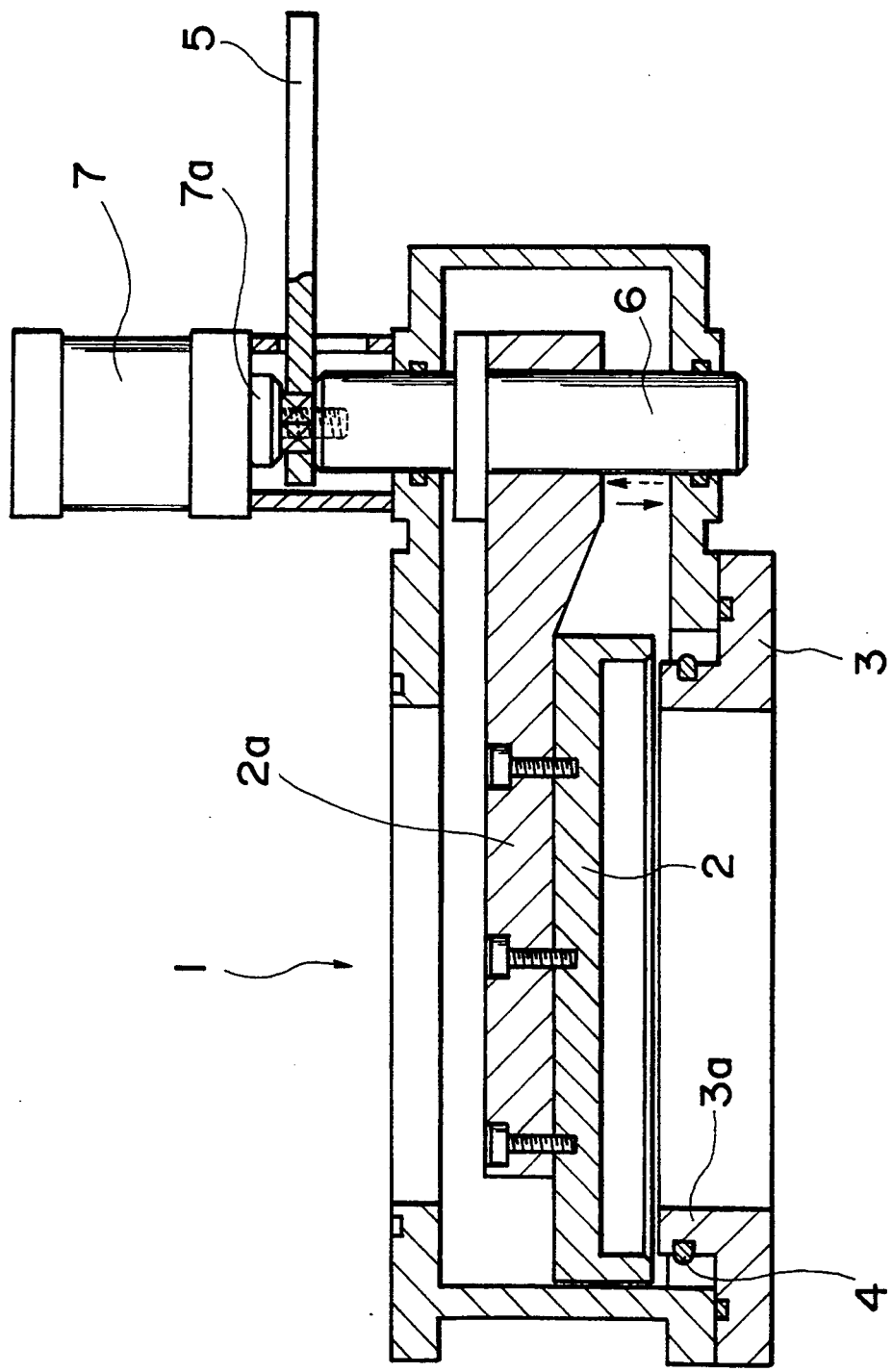
FIG. 4 is a longitudinal section through a prior art isolation valve.

FIGS. 2 and 3 show the isolation valve 16 according to the embodiment of the present invention.

The isolation valve 16 comprises a shutter assembly 18 serving as a valve body opening and shutting the outlet 10a. The shutter assembly 18 comprises a flat base plate 19 fastened to a valve rod 16a and being movable in and out of contact with a lower valve seat 26 of a bottom wall of the casing of the isolation valve 16, a flat ceiling plate 20 provided above the base plate 19 and being movable in and out of contact with an upper valve seat 25 of a top wall of the casing of the isolation valve 16, and a bellows 21 of stainless steel connecting the ceiling plate 20 with the base plate 19.

The base plate 19 and the valve rod 16a have a gas passageway 22 extending radially of the base plate 19 and axially of the valve rod 16a. The gas passageway 22 opens to the interior 18a of the shutter assembly 18 and communicates at the top end of the valve rod 16a with a pipe 23 extending from a gas supply, e.g., an air compressor (not shown). The interior 18a of the shutter assembly 18 defined by the base plate 19, the ceiling plate 20 and the bellows 21 communicates with the gas passageway 22.

The bellows 21 is normally in the contracted position because of the resilience thereof as shown in FIG. 2.

The pipe 23 has a pressure control valve 24 provided intermediate it. When the isolation valve 16 isolates the main chamber from the pull chamber, the interior 18a of the shutter assembly 18 receives air of a pressure higher than atmospheric pressure from the gas supply through the pressure control valve 24, so that the base plate 19 and the ceiling plate 20 shift from the positions of FIG. 2 to the positions of FIG. 3.

The pressure control valve 24 is a valve with a drain and has two parts connected with two set pressure sources. A first set pressure of the pressure control valve 24 is atmospheric pressure so that the pressure of the interior 18a of the shutter assembly 18 holds the base plate 19 and the ceiling plate 20 in the contracted positions of the shutter assembly 18 of FIG. 2. A second set pressure of the pressure control valve 24 has a predetermined value higher than atmospheric pressure so that the pressure of the interior 18a of the shutter assembly 18 holds the base plate 19 and the ceiling plate 20 in the extended positions of the shutter assembly 18 of FIG. 3. The second set pressure of the pressure control valve 24 is not restricted to the predetermined value but may have a value higher than the pressure of an inert gas in the main chamber 10 so as to prevent the inert gas from leaking from the main chamber 10 to the pull chamber 17. The first set pressure of the pressure control valve 24 is lower than this value of the second set pressure.

The top wall of the casing of the isolation valve 16 has a circular opening 25a. The annular upper valve seat 25 formed around the opening 25a is engageable in and out of sealing contact with the ceiling plate 20 of the shutter assembly 18. The bottom wall of the casing of the isolation valve 16 has a circular opening 26a. The annular upper valve seat 26 formed around the opening 26a is engageable in and out of sealing contact with the base plate 19 of the shutter assembly 18. The opening 25a is arranged coaxially with the opening 26a. The diameter of the opening 25a is equal to that of the opening 26a. The diameter of the opening 25a may be smaller or larger than that of the opening 26a. The openings 25a and 26a may be noncircular.

The underside of the base plate 19 has an O-ring 27 in order to enhance the sealing performance between the base plate 19 and the lower valve seat 26. Alternatively, the lower valve seat 26 may have an O-ring in and out of contact with the underside of the base plate 19.

The valve rod 16a is movable up and down by the inert gas in the interior 18a of the shutter assembly 18 and a compression coil spring 29, and rotatable by means of a rotating arm 30 fixed to the valve rod 16a. An air cylinder (not shown) drives the rotating arm 30. The valve rod 16a is normally urged upwards by the compression coil spring 29 so that the underside of the base plate 19 does not slide on the lower valve seat 26 when the shutter assembly 18 is rotated about the valve rod 16a. The valve rod 16a is rotatable about the axis thereof.

In operation, when the pull chamber 17 is open to the main chamber 10, the air cylinder drives the rotating arm 30 to rotate the shutter assembly 18 from the position of FIG. 2 to a position to fully open the opening 26a while the interior 18a of the shutter assembly 18 is at atmospheric pressure.

On the other hand, when the isolation valve 16 isolates the pull chamber 17 from the main chamber 10, the air cylinder drives the rotating arm 30 to rotate the shutter assembly 18 from the position to fully open the space above the opening 26a to the position of FIG. 2 and then the shutter assembly 18 receives the inert gas from the gas supply through the gas passageway 22. The bellows 21 is extended so that one of the ceiling plate 20 or the base plate 19 first goes into contact with a corresponding one of the valve seats 25 or 26 and then the other goes into contact with the other of the valve seats 25 and 26 (see FIG. 3). Thus, the isolation valve 16 isolates the pull chamber 17 from the main chamber 10.

When the underside of the base plate 19 of the shutter assembly in the extended position by the inert gas in the shutter assembly 18 receives the pressure of the main chamber 10, the upper valve seat 25 supports the ceiling plate 20 and the base plate 19 depresses the lower valve seat 26 uniformly around the opening 26a by the gas pressure of the interior 18a of the shutter assembly 18 to enhance the sealing performance of the isolation valve 16.

On the other hand, when the single crystal rod is taken out of the pull chamber 17, the pull chamber 17 is made vacuum and the inert gas is introduced into the pull chamber 17, the isolation valve 16 securely isolates the main chamber 10 from the pull chamber 17 since the ceiling plate 20 is in tight contact with the upper valve seat 25 and the pressure of the interior 18a of the shutter assembly 18 is higher than the pressure of the main chamber 10. Thus, the isolation valve 16 securely prevents an abnormal reduction in the pressure of the main chamber 10 and an air pollution of the atmosphere of the main chamber 10.

Since the isolation valve 16 employs the inert gas as a working fluid, it securely prevents the air pollution even if the inert gas would leak into the main chamber 10 due to a damage in the bellows 21. The working fluid is not restricted to inert gases but may be other gases, water and other liquids. In particular, water and the other liquids also serve as a coolant. The base plate 19 and the ceiling plate 20 are not restricted to flat plates but may be trays having a low rim.

The present invention is not rigidly restricted to the embodiments described above. It is to be understood that a person skilled in the art can easily change and modify the present invention without departing from the scope of the invention defined in the appended claims.

What is claimed is:

1. An isolation valve for a single crystal pulling apparatus, the single crystal pulling apparatus having a main chamber in which a crucible holds a melt of a raw material, the single crystal pulling apparatus having a pull chamber which receives a single crystal pulled from the melt, the isolation valve for the single crystal pulling apparatus comprising:

a valve casing having two opposing valve seats, a first valve seat having a first opening communicable with a main chamber, a second valve seat having a second opening communicable with a pull chamber;

a valve rod having a longitudinal axis located within the valve casing, the valve rod being longitudinally movable along the axis and rotatable about the axis;

a valve body rotatably mounted within the valve casing about the longitudinal axis, the valve body including a first plate movable in and out of sealing contact with the first valve seat to open and shut the first opening, a second plate movable in and out of sealing contact with the second valve seat to open and shut the second opening, and a bellows connecting the first plate to the second plate, the first plate being fastened to the valve rod;

a passage communicable with a fluid supply and with an interior of the valve body defined by the first plate, the second plate and the bellows, the passage enabling a working fluid from the fluid supply to pass to the interior of the valve body;

a spring biasing member acting on the valve rod, the biasing member biasing the valve rod axially so that the first plate is out of contact with the first valve seat during rotation of the valve body; and means, provided intermediate the passage, for controlling the pressure of the interior of the valve body, the controlling means having a first set pressure of the working fluid at which the first plate is in sealing contact with the first valve seat and the second plate is in sealing contact with the second valve seat, the controlling means having a second set pressure of the working fluid at which the first plate is out of sealing contact with the first valve seat and the second plate is out of contact with the second valve seat.

2. The isolation valve for a single crystal pulling apparatus as recited in claim 1, wherein the working fluid is a gas.

3. The isolation valve for a single crystal pulling apparatus as recited in claim 1, wherein the working fluid comprises an inert gas.

4. The isolation valve for a single crystal pulling apparatus as recited in claim 1, wherein the working fluid comprises a liquid coolant.

5. The isolation valve for a single crystal pulling apparatus as recited in claim 1, wherein the passage extends through the first plate.

6. The isolation valve for a single crystal pulling apparatus as recited in claim 1, wherein the first valve seat is located around the first opening, the second valve seat is directly opposed to the first valve seat, the second valve seat supporting the second plate when the second plate is in sealing contact with the second valve seat, and the first plate being uniformly supported against the first valve seat via the working fluid in the interior of the valve body when the first plate is in sealing contact with the first valve seat due to pressure within the bellows and the directly opposed relationship of the first and second valve seats.

7. The isolation valve of claim 1, wherein the passage extends axially through the valve rod and laterally through the first plate.

8. The isolation valve of claim 1, further comprising an air cylinder for driving the rotation of the valve rod.

9. An isolation valve for a single crystal pulling apparatus, the single crystal pulling apparatus having a main chamber in which a crucible holds a melt of a raw material, the single crystal pulling apparatus having a pull chamber which receives a single crystal pulled from the melt, the isolation valve for the single crystal pulling apparatus comprising:

a valve casing having two opposing valve seats, a first valve seat having a first opening communicable with the main chamber and formed around the first opening, a second valve seat having a second opening communicable with the pull chamber and formed around the second opening, the first and second openings being circular and arranged coaxially with each other;

a valve rod having a longitudinal axis located within the valve casing, the valve rod being longitudinally movable along the axis and rotatable about the axis;

a shutter rotatably mounted within the casing about the longitudinal axis, the shutter including a first plate movable in and out of sealing contact with the first valve seat to open and shut the first opening, a second plate movable in and out of sealing contact with the second valve seat to open and shut the second opening, and a bellows connecting the first plate to the second plate, the first plate being fastened to the valve rod;

spring means holding the first plate out of sealing contact with the first valve seat when the first plate is opposite to the first valve seat and the second plate is out of contact with the second valve seat;

a gas passage communicable with a gas supply and with an interior of the shutter defined by the first plate, the second plate and the bellows, the gas passage enabling a working gas from the gas supply to pass to the interior of the shutter; and means, provided intermediate the gas passage, for controlling the pressure of the interior of the shutter, the controlling means having a first set pressure of the gas at which the first plate is in sealing contact with the first valve seat and the second plate is in sealing contact with the second valve seat, the controlling means having a second set pressure of the gas at which the first plate is out of sealing contact with the first valve seal and the second plate is out of contact with the second valve seat.

10. The isolation valve of claim 9, wherein the passage extends axially through the valve rod and laterally through the first plate.

11. The isolation valve of claim 9, further comprising an air cylinder for driving the rotation of the valve rod.

* * * * *